(12) United States Patent
Botma et al.

(10) Patent No.: US 7,130,023 B2
(45) Date of Patent: Oct. 31, 2006

(54) LITHOGRAPHIC APPARATUS, MIRROR ELEMENT, DEVICE MANUFACTURING METHOD, AND BEAM DELIVERY SYSTEM

(75) Inventors: Hako Botma, Eindhoven (NL); Ewoud Vreugdenhil, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 111 days.

(21) Appl. No.: 10/731,429

(22) Filed: Dec. 10, 2003

(65) Prior Publication Data

US 2004/0150807 A1  Aug. 5, 2004

(30) Foreign Application Priority Data

Dec. 18, 2002 (EP) .................................. 02080346

(51) Int. Cl.
  *G03B 27/72* (2006.01)
  *G03B 27/42* (2006.01)
  *G03B 27/54* (2006.01)
  *G02B 5/30* (2006.01)

(52) U.S. Cl. ............................ 355/71; 355/53; 355/67; 359/352

(58) Field of Classification Search .................. 355/35, 355/67, 53, 71; 356/453; 250/227.29; 359/352, 359/627, 485
  See application file for complete search history.

(56) References Cited

U.S. PATENT DOCUMENTS

| | | | | |
|---|---|---|---|---|
| 4,900,137 A | * | 2/1990 | Carter | .......................... 359/488 |
| 5,475,213 A | * | 12/1995 | Fujii et al. | ............. 250/214 LA |
| 5,627,847 A | * | 5/1997 | Leger | .............................. 372/9 |
| 5,652,745 A | * | 7/1997 | Noguchi et al. | ........ 369/112.16 |
| 6,011,652 A | * | 1/2000 | Cushing | ...................... 359/588 |
| 6,034,805 A | * | 3/2000 | Lai | .............................. 359/202 |
| 6,339,501 B1 | | 1/2002 | Kameyama et al. | |
| 2002/0001134 A1 | | 1/2002 | Shinoda | |
| 2002/0067546 A1 | * | 6/2002 | Takahara et al. | ............. 359/487 |
| 2002/0154282 A1 | * | 10/2002 | Mori | ............................ 355/53 |
| 2004/0125374 A1 | * | 7/2004 | Berger et al. | ................ 356/364 |
| 2004/0184019 A1 | * | 9/2004 | Totzeck et al. | ................ 355/71 |
| 2005/0099635 A1 | * | 5/2005 | Kakuchi et al. | ............. 356/515 |

FOREIGN PATENT DOCUMENTS

EP   0 854 374   7/1998

* cited by examiner

*Primary Examiner*—Rodney Fuller
*Assistant Examiner*—Kevin Gutierrez
(74) *Attorney, Agent, or Firm*—Pillsbury, Winthrop, Shaw Pittman, LLP

(57) ABSTRACT

A lithographic projection apparatus includes a radiation system for providing a projection beam of radiation, a support structure for supporting a patterning device, the patterning device serving to pattern the projection beam according to a desired pattern, a substrate table for holding a substrate, a projection system for projecting the patterned beam onto a target portion of the substrate, an illumination system for conditioning the beam of radiation beam so as to provide a conditioned radiation beam so as to be able to illuminate said patterning means, and a beam delivery system including redirecting elements for redirecting and delivering the projection beam from the radiation system to the illumination system. The radiation beam is arranged to have a predetermined polarization state and the redirecting elements are arranged to provide a minimum radiation loss in relation to the predetermined polarization state of the radiation beam.

19 Claims, 3 Drawing Sheets

LITHOGRAPHIC APPARATUS, MIRROR ELEMENT, DEVICE MANUFACTURING METHOD, AND BEAM DELIVERY SYSTEM

This application claims priority from European Patent Application 02080346.6, filed Dec. 18, 2002 which is herein incorporated by reference in its entirety.

BACKGROUND OF THE INVENTION

1. Field of the Invention

The present invention relates generally to a lithographic projection apparatus comprising and more particularly to lithographic projection apparatus having polarization compensation.

2. Description of the Prior Art

The term "patterning device" or "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

SUMMARY OF THE INVENTION

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g., in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4, incorporated herein by reference.

For the sake of simplicity, the projection system may hereinafter be referred to as the "lens;" however, this term should be broadly interpreted as encompassing various types of projection system, including refractive optics, reflective optics, and catadioptric systems, for example. The radiation system may also include components operating according to any of these design types for directing, shaping or controlling the projection beam, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

In the present document, the terms "radiation" and "beam" are used to encompass all types of electromagnetic radiation, including ultraviolet (UV) radiation (e.g., with a wavelength of 365, 248, 193, 157 or 126 nm) and extreme ultra-violet (EUV) radiation (e.g., having a wavelength in the range 5–20 nm), as well as particle beams, such as ion beams or electron beams.

Prior art photolithographic systems generally comprise a radiation source located at a certain distance from the actual projection system. In most setups, the generators of radiation, such as laser systems or the like, are situated in another location, oftentimes even on a different floor in a building. A regular setup for such a lithographic system is a laser that is located on one floor of a building, and an illumination and projection system that is located on another floor. Small or large, such a distance introduces the need for a beam delivery system for transporting and delivering the beam from the radiation source to the location where the incident radiation is actually used in the photolithographic process, i.e., to an illumination system wherein the radiation beam is first conditioned so as to provide optimal illumination characteristics, and then projecting the beam in order to transfer a lithographic pattern from a patterning means, such as a mask, to a target material.

The beam delivery systems generally comprise a set of reflective mirrors and/or other light guiding elements. An illustrative setup for such prior art beam control is for instance depicted in FIG. 2. In the ever increasing demand for higher resolution and throughput of the photolithographic process, a necessity arises to further improve the quality of the radiation beam in the photolithographic system. In particular, it has been found, that in order to obtain a high throughput and good photolithographic results, a generally high intensity of the radiation beam is required. Especially in more advanced photolithography, wherein deep ultraviolet light (DUV, typically ranging from 248–127 nm) is used, or even extreme ultraviolet light (EUV, e.g., having a wavelength in the range 5–20 nm), it has been shown to be increasingly difficult and expensive to generate a radiation beam having suitable energetic characteristics.

Therefore, the inventors have identified a desirability to modify the current photolithographic system in order to minimize energy loss, in particular to maximize the energy transmission by the beam delivery system from the radiation source to the illumination system.

Hence, the invention, as an aspect of certain embodiments, provides a photolithographic system which is arranged in order to provide a maximal energy output, while minimizing costs and adaptations. Certain embodiments further simplify the beam delivery system, in order to provide a beam delivery system that has less complexity and is more versatile in meeting requirements for bridging certain distances.

To achieve these and other features, embodiments of the invention provide a photolithographic system wherein a radiation source is arranged to provide a beam having a predetermined polarization state and said redirecting elements are arranged to provide a minimum radiation loss in relation to said predetermined polarization state of said radiation beam.

In this way, reflective losses are reduced, thus generating a higher beam intensity while avoiding the need to provide more powerful radiation systems. In a preferred embodiment of the invention, said redirective elements are dielectric mirror elements and said projection beam is arranged to have an s-polarization relative to each of said mirror elements. It has been found that such an s-polarization state, that is, a polarization state that is perpendicular to the plane of incidence spanned by an incoming and reflected beam, shows a considerably higher reflection than a p-polarization state. In the latter state, the polarization direction of the lightbeam is in the plane of incidence.

In order to modify the polarization state of the radiation beam to an optimal s-polarization state respective to a reflecting surface, the beam delivery system preferably comprises at least one polarizing plate, such as for example a half lambda plate.

In one embodiment, the polarizing plate is integral with at least one of said mirror elements. The polarizing plate may be bonded to at least one of the mirror elements. Such embodiments may allow that relatively few adaptations to existing systems are required: an ordinary reflective dielectric mirror is replaced by a mirror according to the invention without further adaptations being necessary.

According to embodiments of the invention, an intensity increase of up to 5% per reflection may be feasible. Hence, in a commonly used setup wherein a beam delivery system uses some five redirecting mirrors, by using the photolithographic system of the invention, an increase of light radiation power may be attained of up to 20%. Such a profit may be invested in a larger degree of freedom in configuring the photolithographic system, allowing more redirecting mirrors to be used in the beam delivery system. Conversely, less restrictive demands may be placed on the radiation system, since the beam delivery system according to the invention may allow a higher transmission of the radiation beam. The number of mirrors may even be reduced if the beam is shaped according to certain symmetry properties (such as for example a square shape), eliminating the need to rotate the beam in a particular orientation. Specifically, due to the usually rectangular cross-section of the light beam, bending angles different from 90° are generally not preferable in the beam delivery system. Such a specific rectangular shape may introduce the need for additional mirrors in order to rotate the beam to a desired orientation. Therefore, in a preferred embodiment, in order to reduce the number of reflections, a cross section of said radiation beam is of a square shape prior to entering said beam delivery system.

Embodiments of the invention further relate to a device manufacturing method including: providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material; providing an illumination system for conditioning said beam of radiation beam to illuminate the patterning device; providing redirecting elements for redirecting and delivering said projection beam from a radiation source to the illumination system; arranging said radiation beam to have a predetermined polarization state; and arranging said redirecting elements to provide a minimum radiation loss in relation to said predetermined polarization state of said radiation beam.

In one embodiment, the method comprises arranging said projection beam to have an s-polarization state relative to each of said redirecting elements.

Embodiments of the invention further relate to a mirror element comprising a dielectric reflective layer and a polarizing layer for providing a predetermined polarization state of said radiation beam relative to said reflective layer, said polarizing layer being integral with said dielectric reflective layer.

DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PRESENT INVENTION

Embodiment 1

Figure 1:
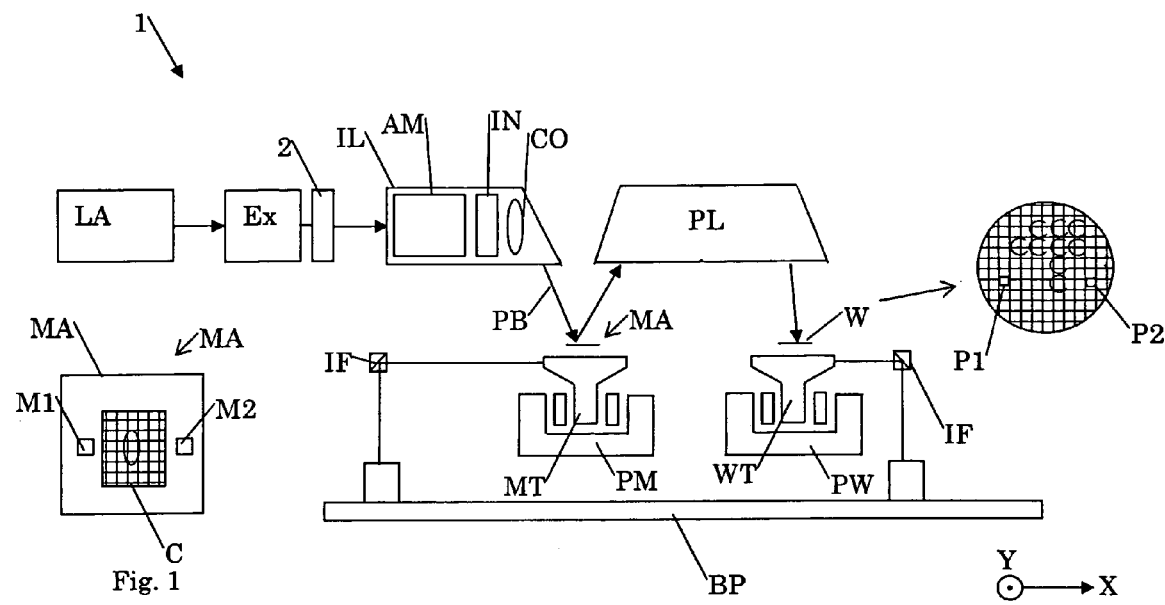
FIG. 1 depicts a lithographic projection apparatus according to an embodiment of the invention.

FIG. 1 schematically depicts a lithographic projection apparatus 1 according to a particular embodiment of the invention. The apparatus comprises:

a radiation system Ex, 2, IL, for supplying a projection beam PB of radiation (e.g., light in the deep ultraviolet region). In this particular case, the radiation system also comprises a radiation source LA;

a first object table (mask table) MT provided with a mask holder for holding a mask MA (e.g., a reticle), and connected to first positioning means PM for accurately positioning the mask with respect to item PL;

a second object table (substrate table) WT provided with a substrate holder for holding a substrate W (e.g., a resist coated silicon wafer), and connected to second positioning means PW for accurately positioning the substrate with respect to item PL; and a projection system ("lens") PL for imaging an irradiated portion of the mask MA onto a target portion C (e.g., comprising one or more dies) of the substrate W.

As here depicted, the apparatus is of a reflective type (i.e., has a reflective mask). However, in general, it may also be of a transmissive type, for example (with a transmissive mask). Alternatively, the apparatus may employ another kind of patterning device, such as a programmable mirror array of a type as referred to above.

The source LA (e.g., an excimer laser) produces a beam of radiation. This beam is fed into an Illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of a beam delivery system 2); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means PW (and interferometric measuring means IF), the substrate table WT can be moved accurately, e.g., so as to position different target portions C in the path of the beam PB. Similarly, the first positioning means PM can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
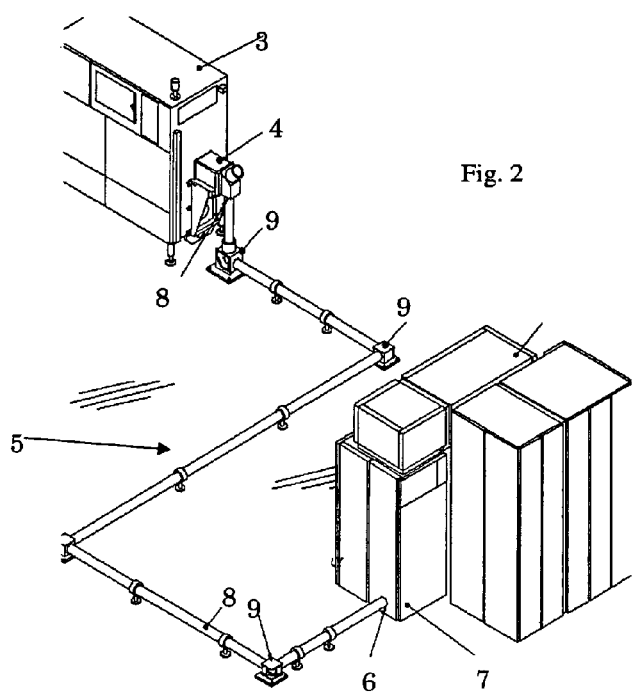
FIG. 2 depicts a beam delivery system of a lithographic projection apparatus.

In FIG. 2, a more detailed drawing of a beam delivery system 2 is illustrated. In the figure, a radiation beam exits an excimer laser source 3 for generating laser light in the DUV or VUV-range (for example 248, 193, 157, or 127 nm). The beam enters a beam expander unit 4, wherein the beam is adjusted to have a required cross-section. The beam expander unit 4 is connected to a tubing 5 for providing a closed environment for transporting the laser light. Usually, this tubing 5 comprises a purposive gas, for example, pure nitrogen gas in order to provide an optimal transmission for the light beam. In this context, transmission of a beam delivery system may be defined as the ratio of outcoming and incoming energy in the beam delivery system, that is the energy Ebd measured near an entrance port 6 of the illumination system 7 and the output energy EL of the laser system.

The tubing 5 is generally designed to provide a transport in a protective environment and is usually comprising a plurality of straight tubes 8, connected through 90° bends 9. These bends 9 comprise a redirecting element, usually, a dielectric mirror oriented at 45° with respect to an incoming beam direction. Due to the usually rectangular cross-section of the light beam, bending angles different from 90° are generally not preferable. However, depending on the symmetry properties of the cross section, other angles may be used as well.

According to embodiments of the invention, the polarization state of the light beam is tuned so that it has a predetermined polarization to provide a minimum radiation loss. Specifically, the beam is arranged to have an s-polarization state with respect to the dielectric mirror elements in the bends 9 of the beam delivery system.

Figure 3:
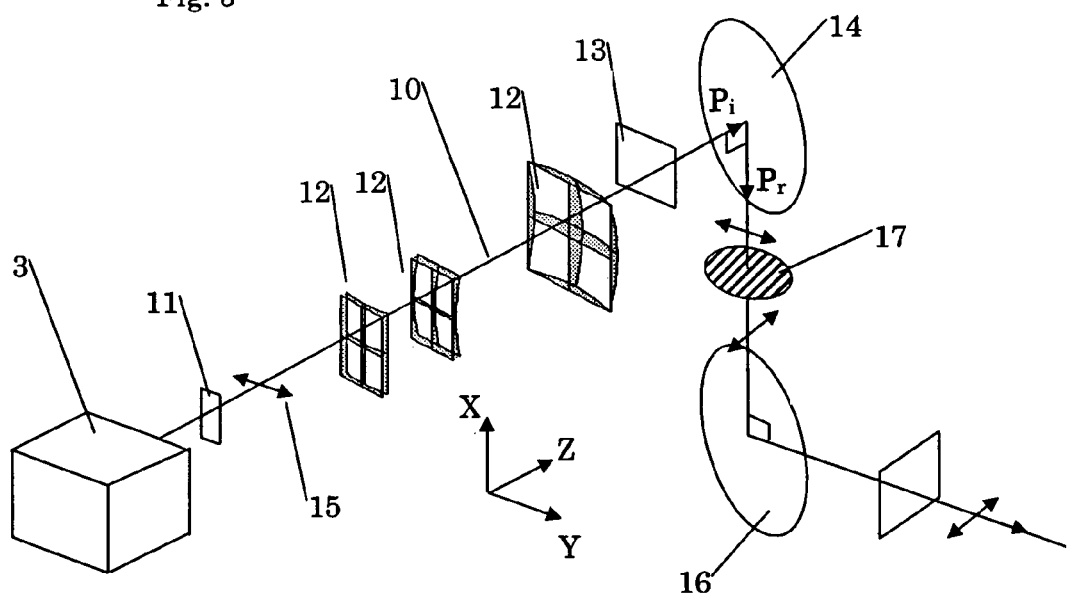
FIG. 3 depicts one embodiment according to the invention.

FIG. 3 shows one embodiment of the invention. Here, a laser beam 10 having a certain characteristic cross section 11 is led through a set of lenses 12, modifying the horizontal and vertical span of the beam. As a result, a generally square beam 13 is generated, that is reflected upon a first bending mirror 14, providing a 90° bend that is oriented downwards. The laser beam is generated by a laser source 3, that provides a substantially horizontal polarization state 15, in the figure in the Y-direction. In principle, the laser 3 may be tuned to provide different polarizations, but this is in practice a quite considerable modification which cannot be performed without dramatic redesign. As depicted in the figure, the plane of incidence is spanned by Poynting vector Pi of the incoming light beam and Poynting vector Pr of the reflected light beam 13. Clearly, the polarization 15 is perpendicular to the plane of incidence, which for reflective mirror 14 is parallel to the X-Z plane. Hence, the beam 13 reflects on the first bending mirror 14 in S-mode, allowing an optimal reflection in the order of 98% of the original beam intensity.

The polarization direction is unaltered by the reflection, hence still in Y-direction. Since the plane of incidence in the second mirror 16 is oriented parallel to the X-Y plane, if unchanged, the polarization state would be parallel to the plane of incidence, which means a p-polarization relative to the second bending mirror 16. Here, a reduced transmission of the beam 13 would result, which would be for a dielectric mirror generally used for these bending mirrors amount to approximately only 94%.

According to the invention, in order to provide an S-orientation with respect to the second bending mirror 16, a polarizing plate 17 is inserted in the radiation beam path. Due to the 90° bending angles, the polarization state of the beam is also to be rotated by 90°, for example by a half lambda plate 17, that is, a transmissive plate having a thickness such that its birefringence causes a phase shift of an integer multiple of the wavelength of the radiation beam plus one half of a wavelength between the two orthogonal components of the polarization vector. Furthermore, the polarizing plate 17 must have dimensions larger than a cross section of the radiation beam 13, which is in practice a dimension of approximately 5×5 cm. By the polarizing plate 17 inserted in the path of the radiation beam 10, the polarization state 15 of the radiation beam is rotated 90° and is then in an s-polarization state relative to the second bending mirror 16.

Figure 4:
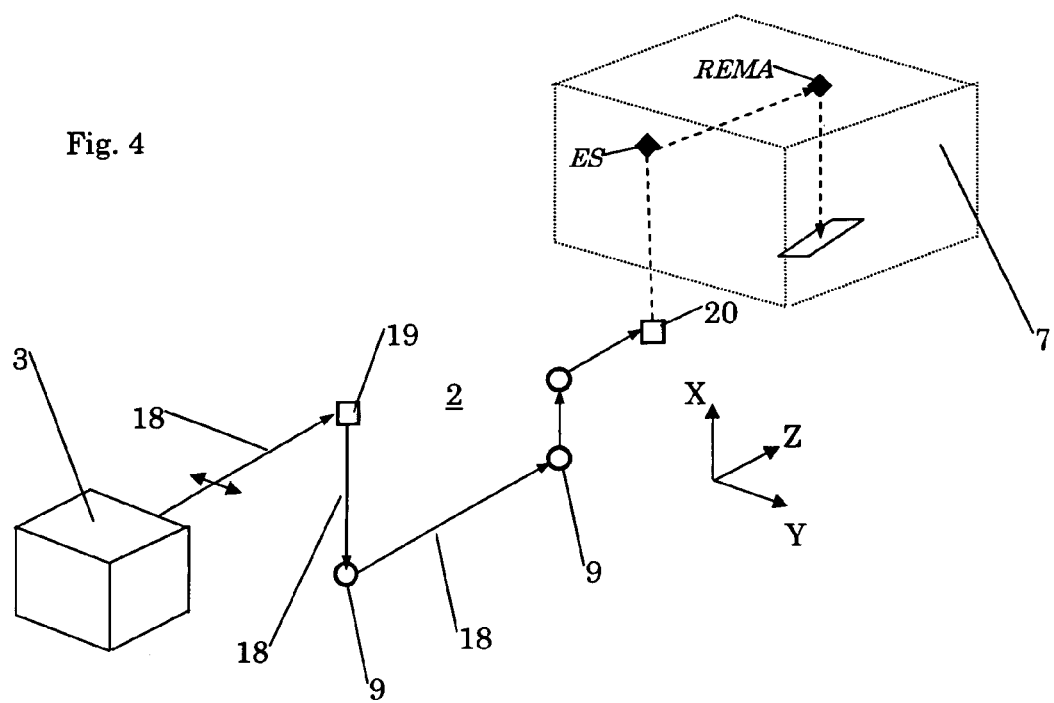
FIG. 4 depicts another embodiment according to the invention.

FIG. 4 shows an alternative setup of the beam delivery system 2, wherein no need exists for modifying a polarization state of the beam since all reflections are of the s-polarization type. In this setup, the beam delivery system 2 comprises straight beam delivery trajectories 18 and bending points 9, all lying in the same plane. For the sake of clarity, not all trajectories in the drawing are referenced by reference numeral 18. This plane is parallel to each plane of incidence for every reflective element. The laser 3 generates a horizontally polarized radiation beam, in the figure pointing in the Z-direction. The beam reflects downwards parallel to the X-direction by a first reflective element 19. This first reflective element is a rotatable, so-called beam steering mirror. By slightly rotating the beam steering mirror 19, a translation of the beam is introduced near the illumination system 7. The beam is further guided towards the illumination system 7 by reflective mirrors that are positioned at a (near) 45° angle with respect to an incoming light beam. Hence the bends 9 introduce 90° (or very close to that amount) angles in the beam delivery system 2. In the setup of FIG. 4, the beam is further guided towards the illumination system 7 and is reflected by a second beam steering mirror 20, which, because of its close position to the illuminator, introduces mainly a variation in pointing direction of the beam in the illuminator 7. Further mirrors are inside the illumination system and beyond, which are schematically depicted by an Energy sensor mirror ES and REMA mirror near the reticle. The path of the beam near or in the illuminator 7 and beyond is depicted by dotted lines. Each of these reflective mirrors are oriented as to have parallel planes of incidence. In order not to require an extra 90° rotation of the beam, preferably the beam is of a square cross section. Hence, for every bend in said setup, a polarization state remains unaltered in a perpendicular direction relative to incoming and outgoing radiation paths, providing an optimal s-polarization reflection.

Under practical circumstances however, it is often required to have one or more so called beam breaks or beam rotations, the latter being defined as a rotation of the plane of incidence between two successive reflections (as illustrated in FIG. 3). Alternatively, depending on the specific beam delivery setup, one may decide to deliberately add one extra beam rotation so as to obtain fewer p-type reflections and more s-type reflections, without using any polarizing plate whatsoever.

Figure 5:
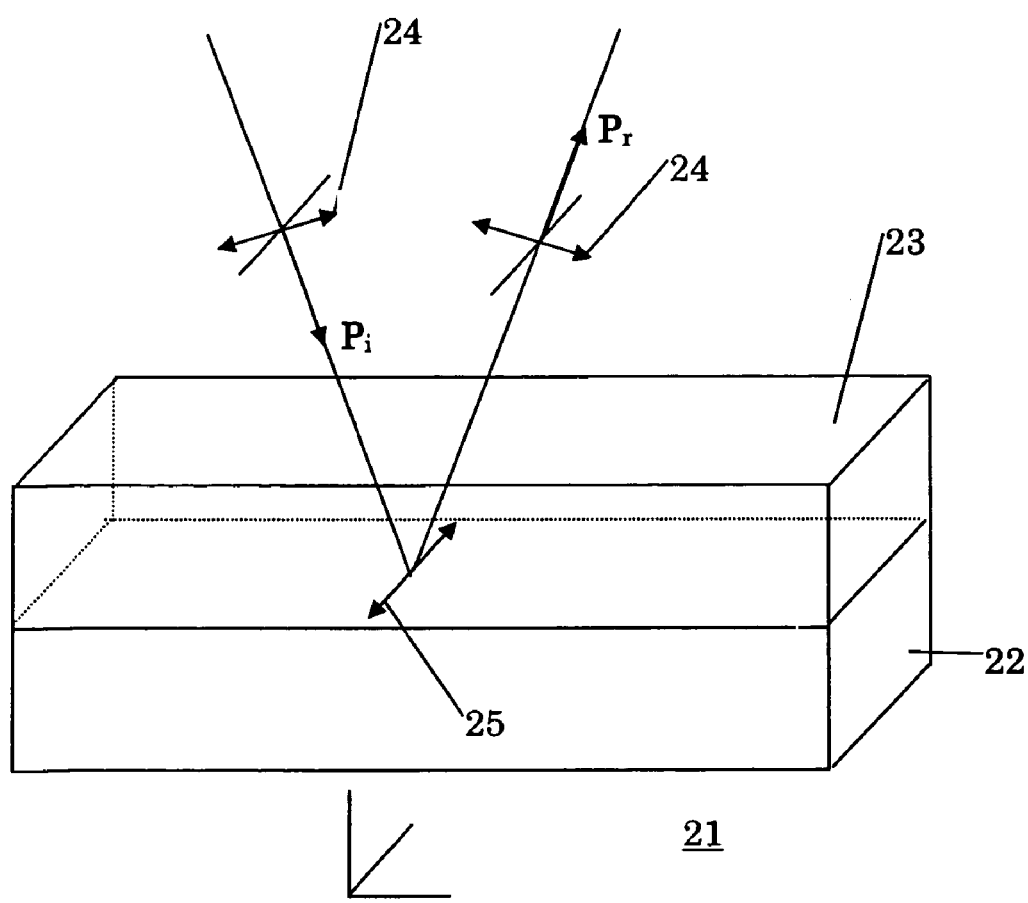
FIG. 5 depicts a reflective mirror element according to the invention.

FIG. 5 depicts an embodiment of the invention for use in a lithographic apparatus. A mirror 21 is shown which is optimized for p-type polarization reflection. That is, the mirror comprises a dielectric reflective layer 22 and a polarizing layer 23 for providing a predetermined polarization state of said radiation beam relative to said reflective layer, said polarizing layer being integral with said dielectric reflective layer. From the figure, it becomes clear that an incoming beam of radiation, having p-type polarization 24 with respect to a plane of incidence, traverses said polarizing layer 23, such as for example a half lambda layer, thereby changing the polarization orientation by 90°. Hence, near the reflective layer, the polarizing state of the beam is modified to s-type polarization 25, offering optimal reflection. The reflected beam traverses the polarizing layer 23 once again in opposite direction and exits with a modified polarization, which is again p-type with respect to the plane of incidence.

While specific embodiments of the invention have been described above, it will be appreciated that the invention may be practiced otherwise than as described. The description is not intended to limit the invention.

What is claimed is:

1. A lithographic apparatus comprising:
   a radiation system to provide a projection beam of radiation;
   a support structure to support a patterning device, the patterning device constructed and arranged to pattern the projection beam according to a desired pattern;
   a substrate table to hold a substrate; and
   a projection system to project the patterned beam onto a target portion of the substrate,
   said radiation system further comprising:
   a beam delivery system comprising redirecting elements to redirect said beam along a beam path that extends from a radiation source to an illumination systems, wherein said radiation source is arranged to provide a beam having a predetermined polarization state and said redirecting elements are arranged to provide a minimum polarization related radiation loss, and
   wherein said beam delivery system is constructed and arranged to maintain the predetermined polarization state relative to each of said redirecting elements, said redirecting elements disposed along said beam path such that a plane of incidence of at least one of said redirecting elements intersects a plane of incidence of at least another one of said redirecting elements.

2. A lithographic apparatus according to claim 1, wherein said redirecting elements are dielectric mirror elements and said beam is arranged to have an s-polarisation state relative to each of said mirror elements.

3. A lithographic apparatus according to claim 1, wherein said beam delivery system comprises at least one polarizing plate to modify a polarization state of said radiation beam.

4. A lithographic apparatus according to claim 3, wherein said polarizing plate is a half lambda plate.

5. A lithographic apparatus according to claim 3, wherein said polarizing plate is in contact with one of said redirecting elements.

6. A lithographic apparatus according to claim 5, wherein said polarizing plate is bonded to one of said redirecting elements.

7. A lithographic apparatus according to claim 1, wherein the beam delivery system includes an optical element that is arranged along said beam path between said at least one of said redirecting elements and said at least another one of said redirecting elements, said optical element configured to change an orientation of said predetermined polarization state.

8. A lithographic apparatus according to claim 7, wherein said optical element is configured to position said predetermined polarization state in a plane that is substantially perpendicular to the plane of incidence of said at least another one of said redirecting elements.

9. A lithographic apparatus according to claim 8, wherein said optical element is configured to rotate said predetermined polarization state by about 90°.

10. A device manufacturing method comprising:
    directing a beam of radiation having a predetermined polarization state along a beam path through a plurality of redirecting elements to an illumination system, the directing being performed such that polarization-related radiation losses are reduced and such that the predetermined polarization state relative to each of said redirecting elements is maintained, said redirecting elements disposed along the beam path such that a plane of incidence of at least one of said redirecting elements intersects a plane of incidence of at least another one of said redirecting elements;
    patterning the beam of radiation according to a desired pattern; and
    projecting the patterned beam of radiation onto at least a portion of a radiation sensitive layer on a substrate.

11. A method according to claim 10, the method further comprising arranging said beam to have an s-polarisation state relative to redirecting elements used in the directing.

12. A method according to claim 10, wherein the beam of radiation which is directed to the illumination system has a substantially square cross-section.

13. A method according to claim 10, further comprising changing an orientation of said predetermined polarization state between said at least one of said redirecting elements and said at least another one of said redirecting elements.

14. A method according to claim 13, wherein changing includes positioning said predetermined polarization state in a plane that is substantially perpendicular to the plane of incidence of said at least another one of said redirecting elements.

15. A method according to claim 14, wherein the positioning includes rotating said predetermined polarization state by about 90°.

16. A manufacturing method comprising:
    arranging a radiation system to provide a beam of radiation with a predetermined polarization state, the radiation system including dielectric mirror elements to redirect the beam from a radiation source and at least one polarizer arranged between at least two of said dielectric mirror elements to modify said radiation to an s-polarization state relative to the dielectric mirror elements, said dielectric mirror elements disposed such that a plane of incidence of at least one of said dielectric mirror elements intersects a plane of incidence of at least another one of said dielectric mirror elements.

17. A method according to claim 16, wherein the radiation system is constructed and arranged to produce the beam of radiation such that it has a substantially square cross-section.

18. A method according to claim 16, wherein the radiation system and mirror elements are mutually arranged such that the beam, when provided, has a substantially s-polarization state relative to at least one of the mirror elements.

19. A method according to claim 18, wherein the beam, when provided, has a substantially s-polarization state relative to each of the mirror elements.

* * * * *